United States Patent [19]
Cade

[11] 3,967,904
[45] July 6, 1976

[54] PRECISION RADIATION SOURCE REGULATION CIRCUIT

[75] Inventor: Phillip J. Cade, Winchester, Mass.

[73] Assignee: Electronics Corporation of America, Cambridge, Mass.

[22] Filed: Jan. 15, 1975

[21] Appl. No.: 541,741

[52] U.S. Cl. ............................... 356/201; 250/205; 315/158; 315/159; 356/207; 356/208
[51] Int. Cl.² ..................... G01N 21/22; G01J 1/32; H05B 37/02
[58] Field of Search ................. 356/207, 208, 201; 250/205; 315/158, 159

[56] References Cited
UNITED STATES PATENTS
3,800,147    3/1974    Shea et al. ......................... 356/208

OTHER PUBLICATIONS
"Phototransistor Regulates . . Intensity," Carvajal, Electronics, vol. 38, No. 20, Oct. 4, 1965, p. 101.

Primary Examiner—Vincent P. McGraw

[57] ABSTRACT

A precision lamp regulation circuit includes a source of AC power, a lamp connected in circuit with the AC source, a transistor switch connected in circuit between the AC source and the lamp, a light sensor optically coupled to respond to the radiation output of the lamp, circuitry for placing the transistor switch in conducting condition at the beginning of a half cycle of applied AC power, and a feedback circuit responsive to the light sensor for placing the transistor switch in non-conducting condition to terminate energization of the lamp during that half cycle of applied AC power.

13 Claims, 5 Drawing Figures

PRECISION RADIATION SOURCE REGULATION CIRCUIT

SUMMARY OF INVENTION

This invention relates to the field of testing and measurement of physical phenomena and more specifically to circuit arrangements for generating a stable radiation output for use in a monitoring system.

The present invention provides a system for producing a stable radiation output in an arrangement that has a long useful life, is rugged and may be used over a wide range of ambient temperatures. While it is anticipated that the invention may be useful in a variety of testing, measuring and experimentation systems, a particular application is in the monitoring of smoke output of large burner systems in which an accurately defined beam of light extends across the smokestack (smoke discharge passage) for distances of up to thirty feet and greater to a detector positioned on the opposite side of the smokestack. A particular concern is the amount of visible particulate matter that is discharged into the atmosphere and to that end it is desired to monitor the effect such particulate matter has in the visible spectrum. The power consumption of the monitoring system should be minimized without impairing the stability of light output over a range of operating conditions, including conditions of both temperature and energizing voltage. The magnitude of the energizing voltage is of particular concern as the light output is a function of the sixth power of the applied voltage.

In accordance with the invention there is provided a precision regulation circuit that includes a source of AC power, a radiation source connected in circuit with the AC source, a transistor switch connected in circuit between the AC source and the radiation source, a radiation sensor optically coupled to respond to the radiation output of the radiation source, circuitry for placing the transistor switch in conducting condition at the beginning of a half cycle of applied AC power, and a feedback circuit responsive to the radiation sensor for placing the transistor switch in non-conducting condition to terminate energization of the radiation source during that half cycle of applied AC power.

This circuit provides a stable radiation output and has particular application in a system for monitoring particulate matter in a smokestack, output radiation from the lamp being focused in a narrow beam that traverses the smokestack for detection on the opposite side thereof. The circuit may be of half wave or full wave type, a transistor switch commencing conduction at the beginning of alternate half cycles of applied AC power in the half wave system and at the beginning of every half cycle in the full wave system. In particular embodiments of the invention the radiation source is a low voltage (2.5 volts at 2½ amperes) incandescent lamp that has a rugged, compact filament and an output of about ten candlepower. In such embodiments the filament is heated to incandescence for generating light output in the visible spectrum and a transistor switch is conductive at the beginning of either every or alternate AC half cycles, and the light sensor responds to the radiation output of the lamp to generate a feedback signal that places the transistor switch in non-conducting condition after the lamp has produced a predetermined light output during the initial portion of its half cycle of conduction.

In operation, the transistor switch conducts with low voltage drop at the beginning of a half cycle and applies AC electrical power to the lamp. With the energization of the lamp filament, the radiation output, after a slight thermal lag starts to increase rapidly. This increasing radiation output is sensed by a semiconductor photosensor which produces an output through an inverting high gain stabilized amplifier to turn off the transistor switch. This terminates the heating of the lamp filament and its radiation output starts to decay. When the radiation level falls below a preset threshold, the transistor switch is reconditioned and is switched into fully saturated condition at the beginning of the next half cycle for again supplying energy to the lamp and repeating the cycle. A time delay included in the amplifier circuitry prevents premature switching of the feedback signal. Should the applied voltage from the AC source increase, the photosensor will cause the transistor switch to turn off earlier in the cycle and similarly should the applied AC voltage decrease, the sensor will delay that turn off until later in the cycle. Thus the system provides regulation of radiation output, a typical regulation in a system for monitoring a smokestack being within 0.5 percent over a change in supply voltage of 30 percent, in a fast acting arrangement of low power consumption.

Other objects, features and advantages of the invention will be seen as the following description of particular embodiments thereof progresses, in conjunction with the drawings, in which.

DESCRIPTION OF PARTICULAR EMBODIMENTS

Figure 1:
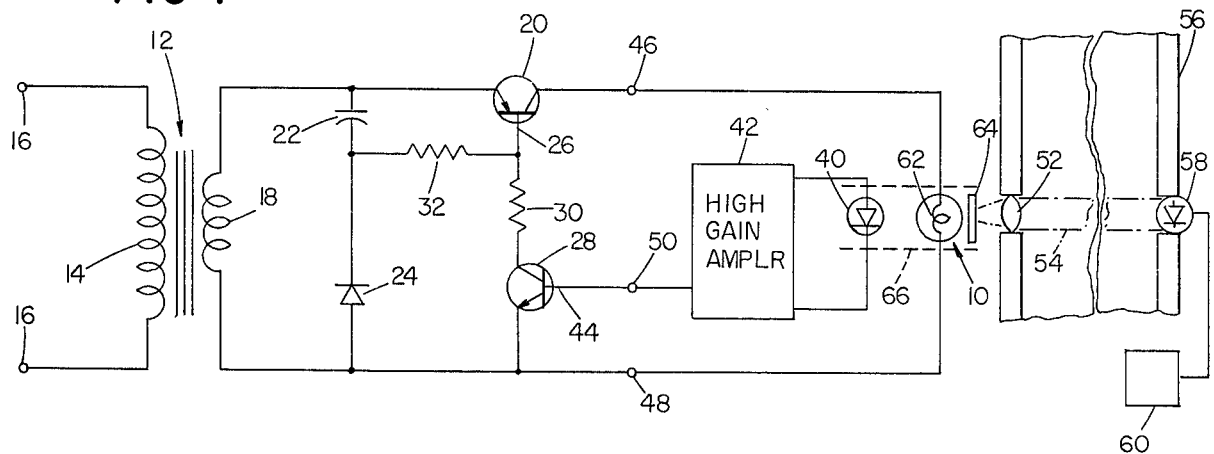
FIG. 1 is a block diagram of an embodiment of the invention.

With reference to FIG. 1, lamp 10 is energized from an AC source in the form of step down transformer 12 whose primary winding 14 has terminals 16 connected to a suitable 60 Hertz source, the voltage of which may vary over a range of 90–140 volts; and whose secondary winding 18 provides an output of about 3½ volts rms with 115 volts applied to primary 14. Connected in series between winding 18 and light source 10 in a transistor switch 20. Connected in across winding 18 is a capacitor 22 and diode 24. The base 26 of transistor 20 is connected to transistor 28 through resistor 30. A bias resistor 32 is connected between base 26 of transistor 20 of the junction between capacitor 22 and diode 24.

Optically coupled to radiation source 10 is a photosensor 40 in the form of a reverse biased semiconductor diode. Inverting amplifier circuitry 42 is connected to respond to the output of photosensor 40 and provides an output which is applied to the base 44 of transistor 28. Terminals 46, 48 provide power connections between the AC power source and the radiation source 10 and terminal 50 provides a feedback path connection. Lens 52 focuses the radiation from source 10 in a narrow beam 54 which extends across the channel 56 being monitored (e.g. a smokestack) and a sensor 58 (e.g. a semiconductor photosensor) is disposed on the opposite side of the channel from lens 52 for sensing the radiation beam 54 and generating an output that is applied to monitoring circuitry 60.

In this embodiment the light source 10 is an incandescent lamp that has a tungsten filament 62 designed for energization at a nominal voltage of 2½ volts and a current of 2½ amperes. A significant portion of the radiation emitted by light source 10 is in the visible spectrum and a filter 64 may be utilized for limiting radiation in beam. Shielding 66 restricts the field of view of sensor 40 to source 10.

Figure 2:
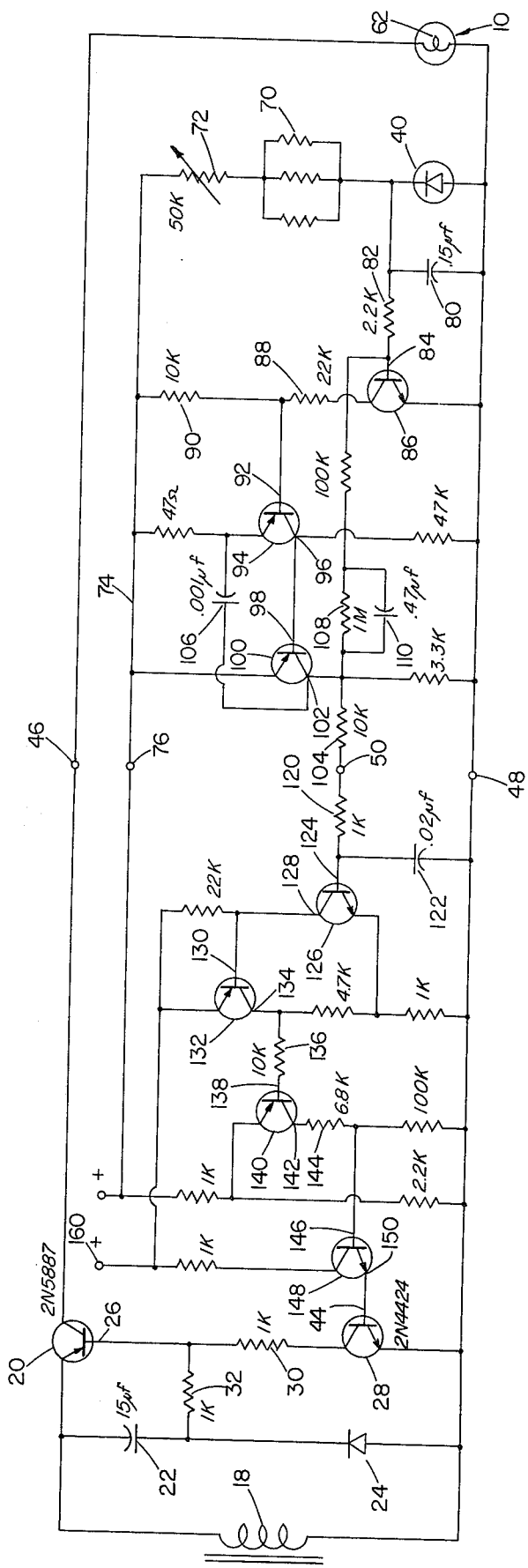
FIG. 2 is a more detailed schematic diagram of the embodiment shown in FIG. 1.

A more detailed understanding of aspects of the embodiment shown in FIG. 1 may be had with reference to FIG. 2. As indicated in that figure, photosensor 40 is a reverse biased silicon diode that is connected in series with a network of trimming resistors 70 and an adjustable resistor 72 between bus 74 that is connected via terminal 76 to a 15 volt regulated power supply source. A filter capacitor 80 is connected across diode 40 and that diode is connected via resistor 82 to the base 84 of transistor 86. The collector of transistor 86 is connected via a voltage dividing network of resistors 88 and 90 to the base 92 of transistor 94. The collector 96 of transistor 94 is connected to the base 98 of transistor 100 and the collector 102 of that transistor is connected via resistor 104 to terminal 50. Capacitor 106 is connected between the collector of transistor 100 and the emitter of transistor 96. Feedback is provided by resistor 108 in parallel with capacitor 110 to the base 84 of transistor 86. This circuit filters pickup from rf sources, sparks and the like and also imposes a time delay on the switching of the feedback signal applied at terminal 50.

Connected to terminal 50 via input network which includes resistor 120 and capacitor 122 is the base 124 of transistor 126. Collector 128 is connected to the base 130 of transistor 132, and collector 134 is connected via resistor 136 to the base 138 of transistor 140. Collector 142 is connected via resistor 144 to the base 146 of transistor 148; and emitter 150 is connected to base 44 of transistor 28. The transistors 132 and 148 are connected to an unregulated power supply at terminal 160. These transistor stages amplify the feedback signal.

Figure 3A:
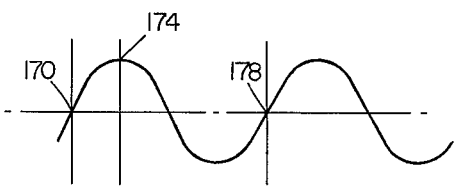
FIGS. 3A and 3B are simplified diagrams indicating aspects of operation of the circuitry shown in FIGS. 1 and 2.
Figure 3B:
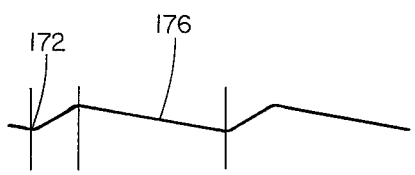

During operation, at the beginning of each positive half cycle as indicated in FIG. 3A at point 170, transistor 20 is conductive and thus connects the AC source to energize lamp 10. After thermal lag of brief duration, reheating of filament 62 starts at point 172 as indicated in FIG. 3B. The resulting exponentially increasing light output is sensed by diode 40 and the reverse current produced by the absorption of light at the PN junction of diode 40 increases, reducing the current flow from the precision current source of resistors 70, 72 so that transistor 86 turns off at a threshold value that is a function of the setting of adjustable resistor 72. With the turn off of transistor 86, transistor 94 is turned off and transistor 100 is turned on applying a feedback signal transition through terminal 50 to the base of transistor 126 switching that transistor on. That action switches transistor 132 on which in turn turns transistors 140, 148 and 28 off to turn off transistor 20 at point 174 (FIG. 3A) abruptly terminating the flow of current to lamp 10. The filament 66 cools reducing the light output along the exponential path indicated at line 176 of FIG. 3B. The reverse current through diode 40 decreases so that after a time delay, transistor 86 is turned on resetting the network and placing transistor 28 in condition for conduction at the commencement of the next positive half cycle at point 178. At that point transistor 20 is turned on, again supplying power to the filament of lamp 10 and increasing output radiation. This circuit provides accurate regulation of the light output independent of changes in conditions such as the amplitude of the applied voltage, the ripple in the light output being in the order of 3–5 percent.

In the circuitry of FIG. 2, line voltage changes of 30 percent cause a change in light output of less than 0.5 percent. The lamp filament 62 is maintained essentially at a constant temperature with resulting stability in spectral characteristics and the relationship of intensity of all different colors radiated by the lamp 10. This would not be the case if the lamp output were regulated by changing the optical aperture or if the receiver sensitivity were compensated by comparing the light output in the smoke path with the light output when directly viewing the lamp. Also, this regulating system in holding the light output constant, provides compensation for film deposits on the lamp bulb which normally occur throughout the life of the lamp as filament material is evaporated and deposits form on the inner surface of the bulb. The regulator is fast-acting, responding in less than one cycle of the supply current, and operates with a high efficiency which not only lowers the power consumption of the device but makes it easier to dissipate the heat generated by losses within the device. For instance, the transistor 20 has a voltage drop of less than 0.3 volts whereas a silicon controlled rectifier of comparable size would have a voltage drop of as much as 2 volts.

Figure 4:
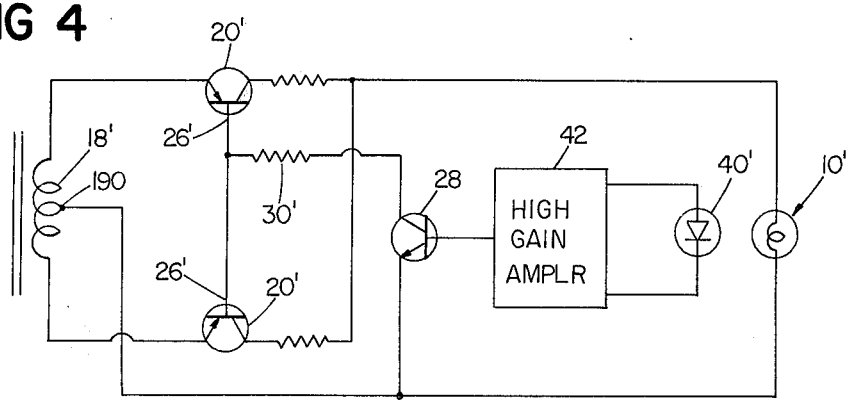
FIG. 4 is a simplified schematic diagram of a second embodiment of the invention.

A full wave arrangement illustrated in FIG. 4 includes a transformer secondary 18' that has a center tap 190 and two transistor switches 20', one connected to each terminal of transformer winding 18'. Lamp 10' is connected across the transformer secondary and sensor 40' provides a signal through inverter amplifier circuitry 42' to transistor switch 28' whose collector is connected through resistor 30' to the bases 26' of the two transistor switches. At the beginning of each half cycle a transistor switch 20' is conductive and is turned off during that portion of each half cycle in response to turn off of switch 28' that is responsive to sensor 40'.

While particular embodiments of the invention have been shown and described, various modifications of the embodiments will be apparent to those skilled in the art, and therefore it is not intended that the invention be limited to the disclosed embodiments or details thereof and departures may be made therefrom within the spirit and scope of the invention.

What is claimed is:

1. A monitoring system comprising a source of AC power,
    a radiation source connected in circuit with said AC source,
    a transistor switch connected in circuit between said AC source and said radiation source,
    a radiation sensor optically coupled to respond to the radiation output of said radiation source,
    circuitry for placing said transistor switch in conducting condition at the beginning of a half cycle of applied AC power to apply power to said radiation source to cause said radiation source to produce an increased radiation output,
    and a feedback circuit responsive to said radiation sensor for placing said transistor switch in non-conducting condition in response to said increased radiation output of said radiation source to terminate energization of said radiation source during that half cycle of applied AC power so that the radiation output of said radiation source is regulated with precision.

2. The system as claimed in claim 1 wherein said radiation source is an incandescent lamp.

3. The system as claimed in claim 1 wherein said radiation sensor is a semiconductor photosensor.

4. The system as claimed in claim 1 wherein said feedback circuit includes stabilized high gain amplifier circuitry.

5. The system as claimed in claim 1 and further including an optical system for focusing radiation from said radiation source in a narrow beam for transmission across a channel, a second radiation sensor for disposition on the opposite side of said channel for sensing radiation in said radiation beam, and output circuitry responsive to said second radiation sensor for providing an indication of the flow of matter in said channel across said radiation beam.

6. The system as claimed in claim 1 wherein said radiation sensor includes a semiconductor device connected in circuit with a precision current source and said feedback circuit includes a plurality of amplification stages and time delay circuitry for delaying the switching of the output of said feedback circuit from one output condition to another.

7. The system as claimed in claim 1 wherein said source of AC power includes a step down transformer, said radiation source is a low voltage incandescent lamp that is connected across the secondary of said transformer, said radiation sensor is a reverse biased semiconductor diode, and said feedback circuit includes stabilized high gain amplifier circuitry connected to control current flow at the base electrode of said transistor switch.

8. The system as claimed in claim 7 wherein said high gain amplifier circuitry includes a plurality of amplification stages and time delay circuitry for delaying the switching of the output of said feedback circuit from one output condition to another.

9. The system as claimed in claim 8 and further including an optical system for focusing radiation from said radiation source in a narrow beam for transmission across a channel, a second radiation sensor for disposition on the opposite side of said channel sensing radiation in said radiation beam and output circuitry responsive to said second radiation sensor for providing an indication of the flow of particulate matter across said radiation beam in said channel.

10. The system as claimed in claim 9 wherein said secondary of said transformer has a tap to which said lamp is connected and further including a second transistor switch connected to said secondary of said transformer for controlling the energization of said lamp during alternate half cycles of said source of AC power.

11. A system for regulating the output of a radiation source comprising a power source terminal,
a radiation source connected in circuit with said power source terminal,
a transistor switch connected in circuit between said power source terminal and said radiation source to control the energization of said radiation source,
a radiation sensor optically coupled to and responsive to the radiation output of said radiation source,
and a feedback circuit responsive to said radiation sensor and connected to control said transistor switch, said feedback circuit in response to a first value of radiation output of said radiation source as sensed by said sensor having a first output condition that places said transistor switch in nonconducting condition to terminate energization of said radiation source and then in response to reduction of radiation output from said radiation source to a second value below said first value as sensed by said sensor having a second output condition that places said transistor switch in conducting condition to again apply power to said radiation source so that said radiation source is alternately energized and de-energized as a function of its radiation output and the radiation output of said radiation source is regulated with precision.

12. The system as claimed in claim 11 wherein said radiation sensor includes a semiconductor device and said feedback circuit includes an amplification stage.

13. The system as claimed in claim 11 wherein said radiation source is a low voltage incandescent lamp, said radiation sensor is a reverse biased semiconductor diode, and said feedback circuit includes stabilized high gain amplifier circuitry connected to control current flow at the base electrode of said transistor switch and time delay circuitry for delaying the switching of the output of said feedback circuit from one output condition to another.

* * * * *